United States Patent [19]
Maksim

[11] Patent Number: 5,273,081
[45] Date of Patent: Dec. 28, 1993

[54] LEAD CONDITIONING APPARATUS AND METHOD FOR SEMICONDUCTOR DEVICES

[75] Inventor: James E. Maksim, Santa Clara, Calif.

[73] Assignee: Precision Technologies, Inc., Santa Clara, Calif.

[21] Appl. No.: 806,054

[22] Filed: Dec. 11, 1991

[51] Int. Cl.$^5$ .............................................. B21F 1/02
[52] U.S. Cl. ..................................... 140/105; 140/147
[58] Field of Search ..................... 140/147, 105, 1; 29/566.3, 838

[56] References Cited

U.S. PATENT DOCUMENTS

| | | | |
|---|---|---|---|
| 3,687,172 | 8/1972 | Suverkropp | 140/147 |
| 3,880,205 | 4/1975 | Linker et al. | 140/147 |
| 4,103,718 | 8/1978 | Steigerwald | 140/105 |
| 4,481,984 | 11/1984 | Linker | 140/147 |
| 4,727,912 | 3/1988 | Gonzalez | 140/147 |
| 4,765,376 | 8/1988 | Leiwe | 140/147 |
| 5,113,916 | 5/1992 | Linker, Jr. | 140/147 |

Primary Examiner—Lowell A. Larson
Assistant Examiner—Michael J. McKeon
Attorney, Agent, or Firm—Flehr, Hohbach, Test, Albritton & Herbert

[57] ABSTRACT

An apparatus and method for conditioning the leads of a semiconductor device having parallel leads projecting in a predetermined configuration. The apparatus includes a device for engaging and massaging the leads to reintroduce a predetermined spacing between the leads, bringing the leads into parallelism. The apparatus further includes a device for forming the leads to at least partially remove any bends in the leads, and a device for reforming the leads to a predetermined configuration. The lead conditioning method includes the steps of bringing the leads into parallelism, forming the leads to a partially unbent condition, and shaping the leads in a desired lead configuration.

30 Claims, 9 Drawing Sheets

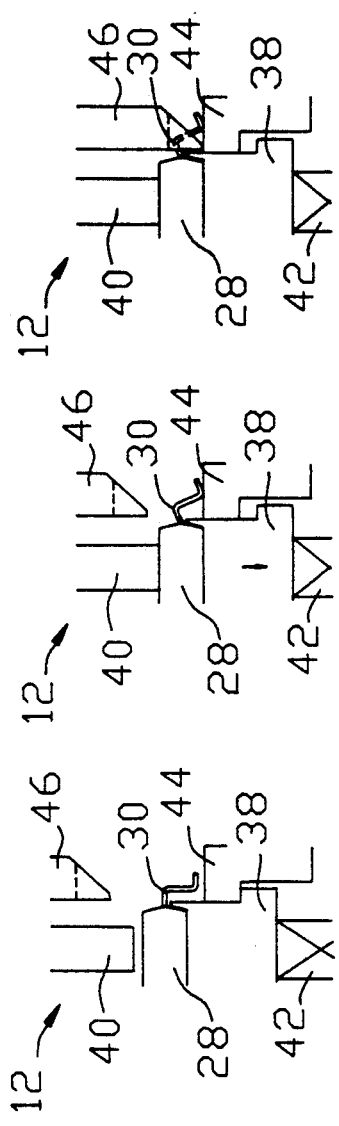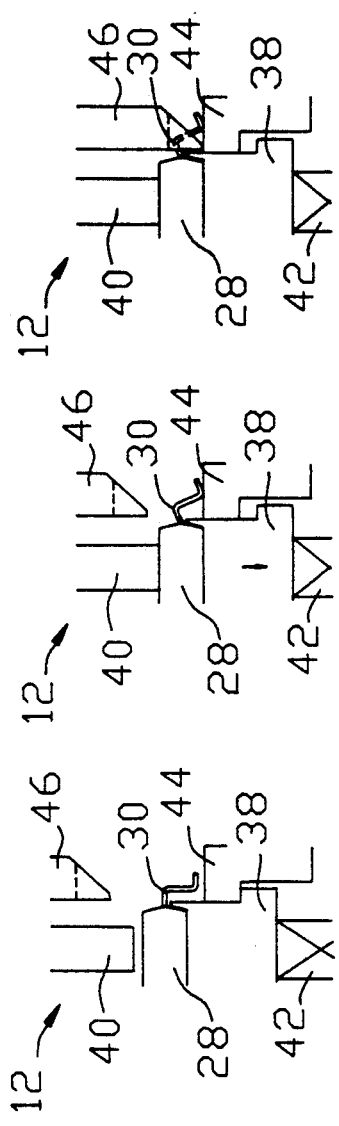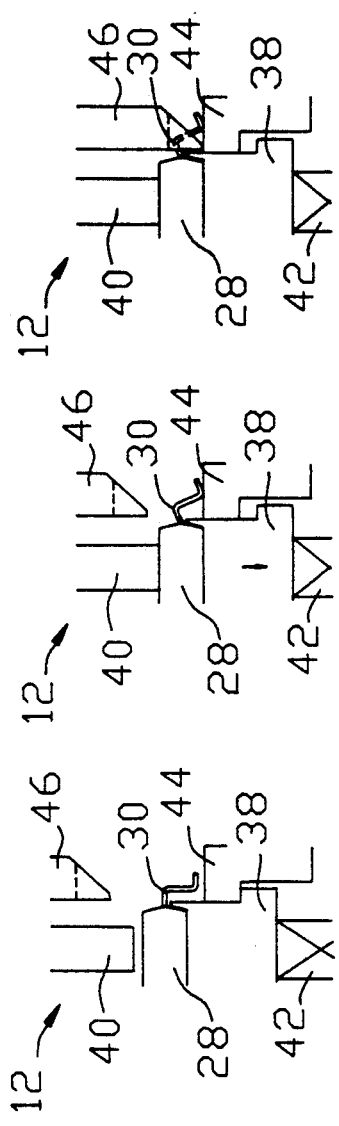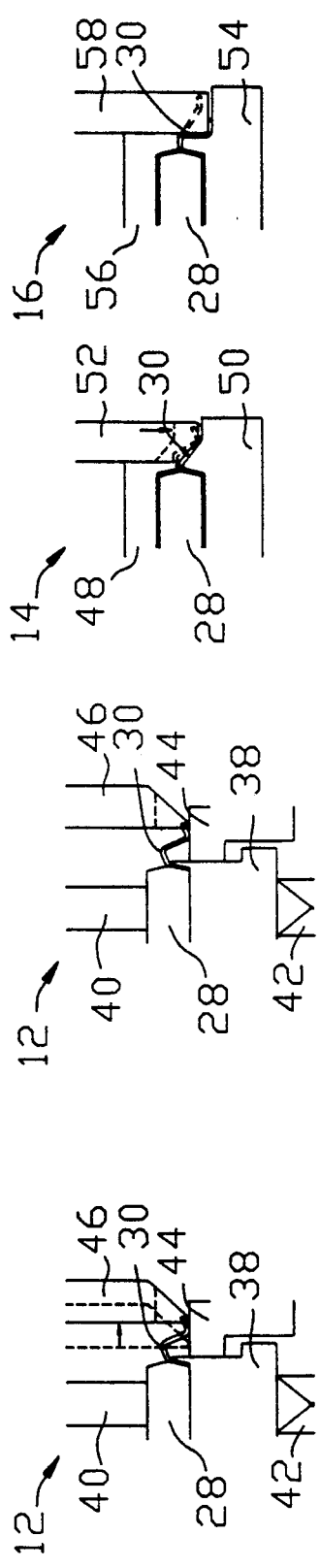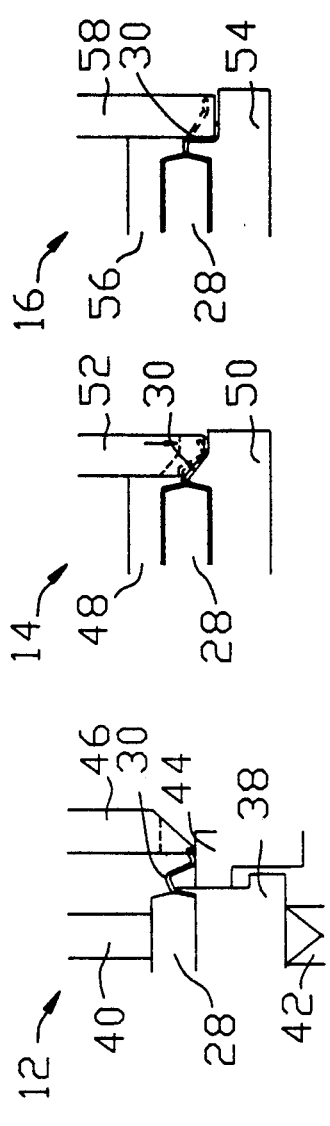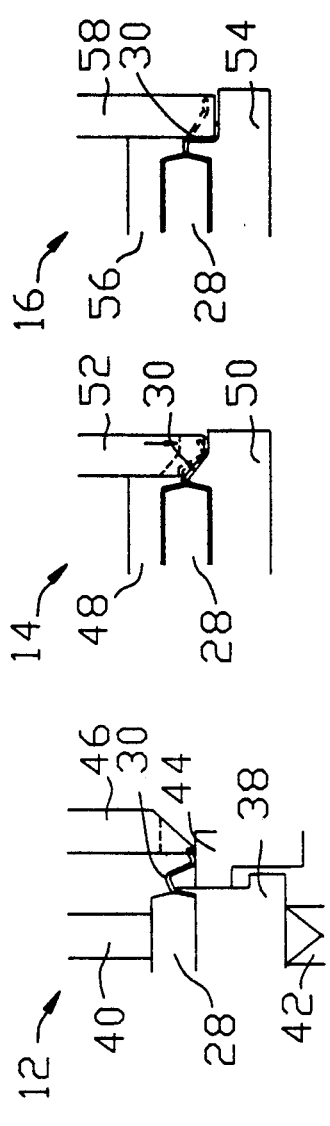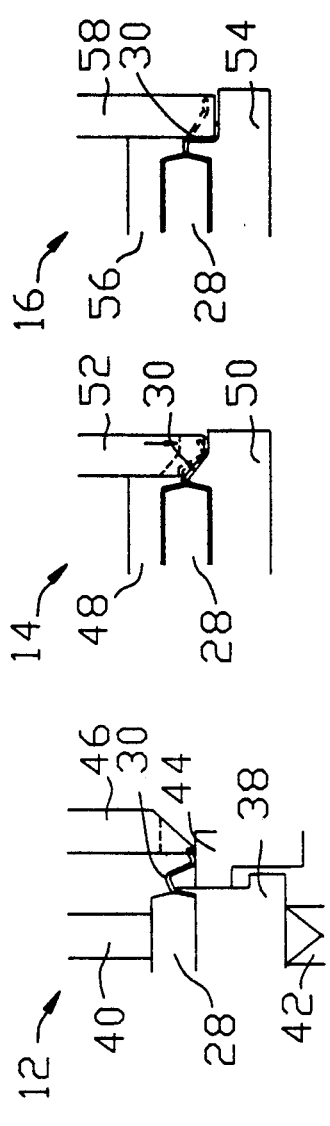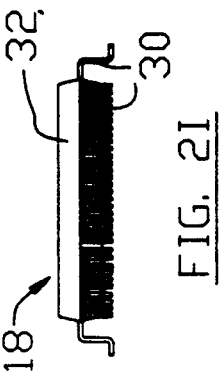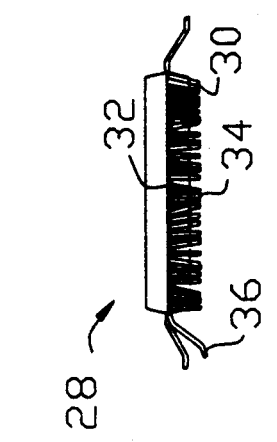

LEAD CONDITIONING APPARATUS AND METHOD FOR SEMICONDUCTOR DEVICES

BRIEF DESCRIPTION OF THE INVENTION

The present invention relates in general to an apparatus and method for conditioning the leads of a semiconductor device. More particularly, the present invention relates to an apparatus and method which reforms the leads of a semiconductor device of the type having parallel leads projecting in a predetermined configuration.

BACKGROUND OF THE INVENTION

In many applications, semiconductor devices are packaged within a molded body for protection against the corrosive elements of the environment. A plurality of lead conductors or leads project from the sides of the molded body for connecting the semiconductor device to an associated circuit such as a circuit board. The parallel leads project from the molded body in a predetermined configuration.

The lead conductors are constructed from a pliable metal which can be easily formed into a desired configuration without damaging either the semiconductor chip or the molded body. However, the application of even a small amount of pressure easily bends the leads away from the desired configuration. Considerable care must be taken when handling the packaged semiconductor device to protect the lead conductors from deformation. Even then, the leads of a large number of semiconductor devices are bent away from the predetermined configuration.

The deformed leads of a semiconductor device may have been pressed close together, removing the preformed parallelism, or bent vertically relative to the molded body so that they do not lie on a common plane. The tips of the bent leads will not meet the correct points on the circuit board when the semiconductor device is mounted in place. The lead conductors on opposing ends of the molded body may be bent, distorting the tweeze or tip-to-tip distance of the device. Because of this distortion, the semiconductor device will not fit within the designated location on the circuit board.

One method of mounting a semiconductor device to a circuit board includes positioning the device by hand and then soldering it in place. More commonly, the semiconductor device is set on the circuit board by an automatic placement machine, with the tips of the leads positioned on a spot of solder paste. The board is then heated, melting the solder paste to secure the leads in place and electrically connect the semiconductor device to other components. If the tips of pressed-together leads are not equally spaced about the perimeter of the molded body, some of the leads will rest directly on the circuit board. Leads bent vertically relative to the molded body will not all contact the surface of the circuit board. Lead tips which are suspended above the board by more than six mils will not touch the solder paste.

Lead conductors which do not contact a spot of solder paste will not be secured in place when the board is tested. The loose tips do not electrically connect the semiconductor device to the other components, resulting in a defective circuit board. The spots of solder paste not touching a lead tip tend to bridge the pads on the board and short the electronic circuit. Thus, a semiconductor device with bent leads is defective and may not be used. Since substantial expense is involved in the manufacture of semiconductor devices, a system which would reform the bent leads to the desired configuration is desirable.

Methods exist in the art for salvaging some of the defective semiconductor devices by straightening the bent leads. The bent lead conductors can be reformed by manually bending each lead back to the appropriate configuration. Using this method does restore many of the deformed devices to an acceptable condition, however the process is extremely time consuming and subject to human error. Additionally, the reformed leads retain an elastic memory of the deformation and tend to partially spring back to the bent condition.

If not severely deformed, the bent lead conductors may be reformed by spanking the semiconductor device or compressing the projecting leads between opposing dies. Compressing the lead conductors will not reintroduce parallelism between the leads. In a slight modification, one of the opposing dies includes teeth to separate the lead conductors. An example of a device implementing this method is disclosed in U.S. Pat. No. 4,727,912, issued to Gonzalez. In Gonzalez, teeth mounted to an upper die are inserted in between the leads of a semiconductor device positioned on a lower die as the upper die is lowered. The upper and lower dies are pressed together, compressing and indenting the leads to remove the elastic memory of the deformation.

Spanking the semiconductor device will reform the lead conductors which have been bent vertically relative to the molded body. However, compressing the leads will only partially remove the elastic memory of the deformation. Once removed from the spanking device, the leads will partially return to the bent condition. Mounting teeth to the upper die as in Gonzalez will reintroduce parallelism between the lead conductors, but severely deformed leads may be damaged by the teeth when the dies are pressed together. Moreover, the leads will spring away from the reintroduced parallelism toward the bent position. A system for reconditioning bent leads which is capable of reintroducing parallelism and the predetermined configuration while substantially erasing lead memory of prior bending is desirable.

An alternative method for conditioning the deformed leads uses opposing blades to straighten and massage the leads as the semiconductor device passes along a track, as is disclosed in U.S. Pat. No. 4,481,984, issued to Linker. In Linker, two wiper blades and an opposing separator blade having a number of grooves are used to separate the leads depending below a semiconductor device supported on a track. Ridges separating the grooves on the separator blade partially engage the less damaged leads and force any crossed leads towards the wiper blades. The first wiper blade directs the crossed leads from the ridges to the grooves, after which the second wiper blade pushes the leads into the grooves and holds them in place. The separator blade and the second wiper blade are oscillated to massage the compressed leads.

Reforming the leads by using opposing blades as in Linker will reintroduce parallelism to the leads while partially removing elastic memory of the deformation. Compressing the lead conductors between the blades reforms the leads which have been bent vertically relative to the molded body of the semiconductor device. However, as in Gonzalez, elastic memory of the deformation is not completely removed by compressing the leads. After the conditioning, the lead conductors will tend to return to the bent condition. Additionally, severely bent leads may be damaged as the blades are pressed together. A system for reconditioning bent leads which reintroduces parallelism and a predetermined configuration while completely erasing elastic memory of the prior deformation is highly desirable.

The device disclosed in Gonzalez will only reform leads projecting from one side of a semiconductor device. Similarly, a device using opposing blades as is disclosed in Linker reforms lead conductors projecting from only two sides of a semiconductor device at the same time. A system which offers the efficiency of simultaneously reconditioning the leads projecting from all four sides of a semiconductor device would be particularly valuable.

OBJECTS AND SUMMARY OF THE INVENTION

It is a primary object of the present invention to provide an apparatus and method for reintroducing parallelism and a predetermined configuration to bent leads.

A further object of the present invention is to provide an apparatus and method for conditioning the leads of a semiconductor device which substantially removes the memory of the prior bends from the leads.

A more general object of the present invention is to provide a system for salvaging damaged semiconductor devices by reconditioning the leads to reintroduce a predetermined configuration to the leads.

In summary, the present invention is particularly suitable for conditioning and reforming the bent leads of a semiconductor device of the type having parallel leads projecting from the body in a predetermined configuration. The lead conditioning apparatus of the present invention includes an engaging and massaging device, a forming device, and a reforming device.

The engaging and massaging device of the present invention reintroduces a predetermined spacing between the bent leads to bring them into parallelism and removes elastic memory of the deformation. The forming device removes the lead memory of the predetermined configuration and any bends distorting the lead configuration. The reforming device reintroduces the predetermined configuration to the leads. The three devices of the present invention condition the bent leads into a properly configured semiconductor device.

The lead conditioning method of the present invention includes the steps of bringing the bent leads into parallelism, forming the bent leads to a partially unbent condition, and shaping the partially unbent leads in a desired lead configuration. Thus, the lead conditioning apparatus and method of the present invention salvages an unusable semiconductor device having distorted leads by reforming the leads into a desired parallel predetermined configuration.

Additional objects and features of the invention will be more readily apparent from the following detailed description and appended claims when taken in conjunction with the drawings.

BRIEF DESCRIPTION OF THE DRAWINGS

FIG. 2A shows a semiconductor device with bent leads.

FIG. 2B shows a schematic diagram of a semiconductor device loaded in an engaging and massaging station in accordance with the present invention, at the beginning of operation.

FIG. 2C shows a schematic diagram of a semiconductor device loaded in an engaging and massaging station in accordance with the present invention, during operation.

FIG. 2D shows a schematic diagram of a semiconductor device loaded in an engaging and massaging station in accordance with the present invention, at the stage of operation following that shown in FIG. 2C.

FIG. 2E shows a schematic diagram of a semiconductor device loaded in an engaging and massaging station in accordance with the present invention, at the stage of operation following that shown in FIG. 2D.

FIG. 2F shows a schematic diagram of a semiconductor device loaded in an engaging and massaging station in accordance with the present invention, at the stage of operation following that shown in FIG. 2E.

FIG. 2G shows a schematic diagram of a semiconductor device loaded in a forming station in accordance with the present invention.

FIG. 2H shows a schematic diagram of a semiconductor device loaded in a reforming station in accordance with the present invention.

FIG. 2I shows a reconditioned semiconductor device with straight parallel leads projecting in a predetermined configuration.

DETAILED DESCRIPTION OF THE INVENTION

Figure 1:
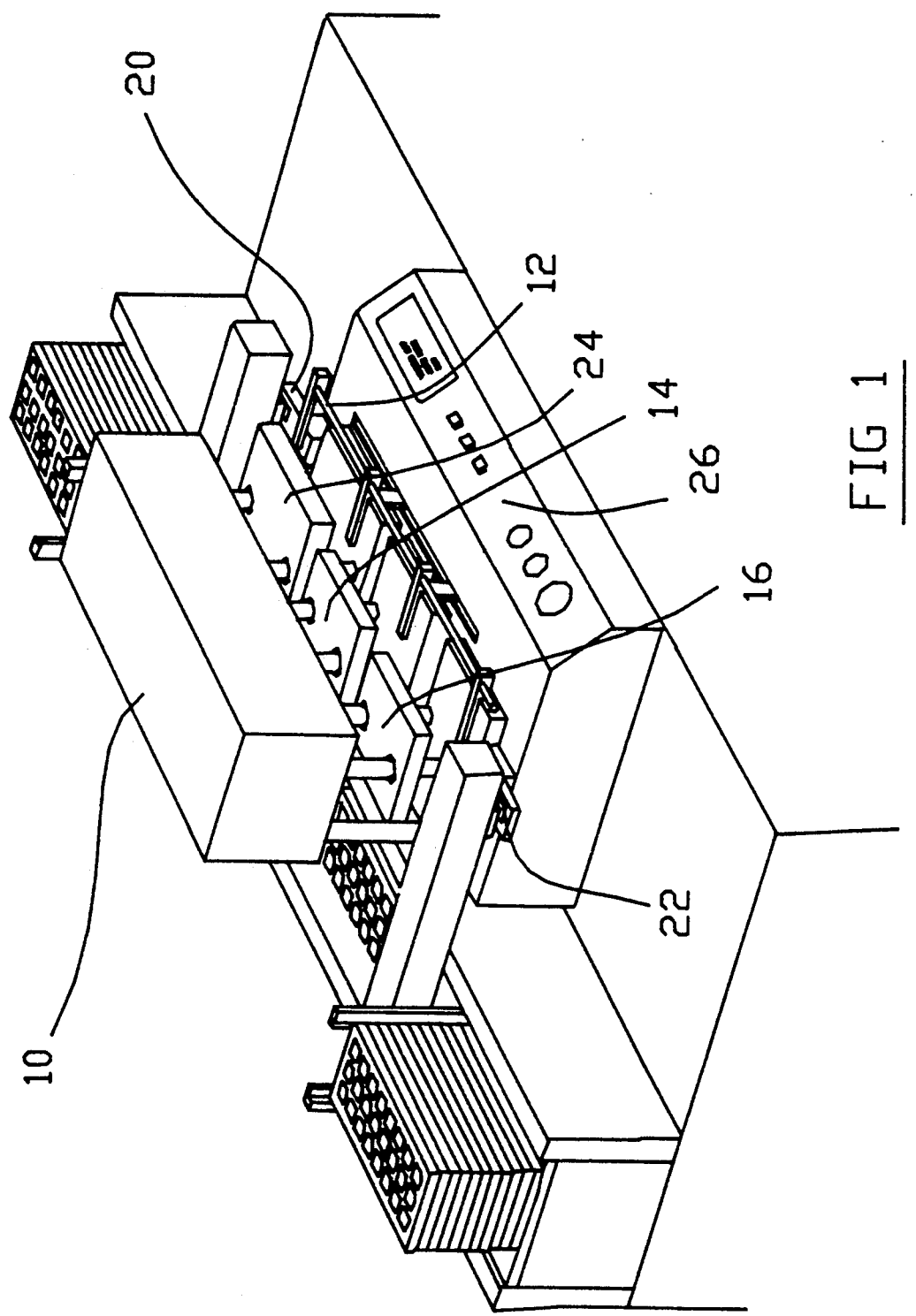
FIG. 1 shows a lead conditioning apparatus in accordance with the present invention.

Reference will now be made in detail to the preferred embodiment of the invention, which is illustrated in the accompanying figures. Turning now to the drawings, wherein like components are designated by like reference numerals throughout the various figures, attention is directed to FIGS. 1 and 2A-2I.

Lead conditioning apparatus 10 incorporating the present invention is shown in perspective in FIG. 1, while the operation of lead conditioning apparatus 10 is represented in FIGS. 2A-2I. The lead conditioning apparatus includes three conditioning stations, engaging and massaging station 12, forming station 14, and reforming station 16. A semiconductor device 18 is passed from starting point 20, through each of the three stations, and to final point 22 by hand or other means for moving the device into position, such as part handling shuttle 24. In the preferred embodiment, a microprocessor (not shown) controls the timing and operation of lead conditioning apparatus 10, with the user initiating the process through control panel 26.

A damaged semiconductor device 28 has a plurality of leads 30 projecting from a molded body 32 in a substantially deformed configuration. As can be seen in FIG. 2A, a number of leads 30 have been pressed together, generally designated 34, and do not project from molded body 32 in a parallel orientation. Other leads have been bent vertically relative to molded body 32, generally designated 36, and are no longer coplanar.

The steps of each of the three stations of lead conditioning apparatus 10 are diagrammatically illustrated in FIGS. 2A-2I, introducing the general operation of the present invention. A more complete discussion of the various components and operation of each of the three stations is provided below in conjunction with FIGS. 3-9.

To reintroduce the parallelism between leads, the damaged device is initially placed either manually or automatically in package nest 38 of engaging and massaging station 12, shown in FIG. 2B. Pressure pin 40 is lowered, pushing down on the damaged semiconductor device and compressing spring 42, shown in FIG. 2C. By lowering the package nest, lead sweep plate 44 encounters leads 30 and bends them in an upward direction relative to molded body 32.

Turning to FIG. 2D, a comb 46 completely engages the leads at a point near the molded body. The comb is moved away from molded body 32 to a massaging position, FIG. 2E, where the comb oscillates first in one direction then in the opposite direction and then back to center, substantially perpendicular to leads 30, as shown in FIG. 2F. The comb and the pressure pin are disengaged and the damaged semiconductor device, now having parallel leads 30, is removed from the package nest.

The damaged semiconductor device is transferred to forming station 14, FIG. 2G, where any bends in leads 30 are partially opened. Pressure pad 48 holds damaged semiconductor device 28 in position on form anvil 50. Form punch 52 is lowered, pressing the leads to the form anvil. The bends in leads 30, represented by the interrupted lines, have been opened by the form punch.

After all bends in leads 30 have been opened at forming station 14, damaged semiconductor device 28 is moved to reforming station 16 where a predetermined configuration will be reintroduced to the leads, shown in FIG. 2H. The damaged semiconductor device is positioned on reform anvil 54, and is held in place by pressure pad 56. Reform punch 58 lowers, pressing the leads against the reform anvil. The reform punch and the reform anvil compress the partially unbent leads, shown by the interrupted lines, into a desired configuration.

Semiconductor device 18, FIG. 2I, is removed from the reforming station with the leads projecting from molded body 32 in a parallel, predetermined configuration. The leads have been partially straightened and reformed without damaging the molded body. The semiconductor device is now in a condition for mounting to a circuit board.

Turning to FIGS. 3-6, engaging and massaging station 12 will now be discussed in greater detail. Package nest 38 is positioned within elevator block 60 which is supported by spring 42. Lead sweep plate 44 surrounds the package nest and bends the leads upward as the elevator block is lowered when pressure pin 40 compresses spring 42. Bending the leads upward relative to molded body 32 enables the comb to reintroduce a predetermined amount of spacing between the leads, and substantially remove elastic memory of the pressed together condition.

The package nest includes means for sensing the positioning of the semiconductor device, such as vacuum sensor 62. Vacuum cup 64 within the elevator block is connected to the surrounding environment through air access opening 66 in package nest 38. When the semiconductor device is accurately placed in the package nest, the molded body blocks the opening, creating a vacuum and triggering the vacuum sensor. The signal is intercepted by the microprocessor and engaging and massaging station 12 may begin operation.

If the semiconductor device is improperly positioned on the package nest, the molded body will not completely cover the opening and no vacuum will be created. The engaging and massaging station will not operate until the semiconductor device has been properly placed, preventing any damage during the lead conditioning process. A semiconductor device having a larger molded body will not fit within the package nest. Since no vacuum is created signalling the start of operation, the part will not be damaged in engaging and massaging station 12. The semiconductor device may be set aside and processed after the necessary adjustments have been made. Thus, the engaging and massaging station of the present invention accounts for the large tolerance in molded body 32.

Pivot plate 68 having a plurality of alignment slots 70 surrounds, but does not support, the lead sweep plate. The pivot plate is free to rotate relative to the lead sweep plate with the aid of crossed roller bearing 72. The elevator block inserted in the center of lead sweep plate 44 prevents any movement by the lead sweep plate in response to the rotation of pivot plate 68.

Pivot plate 68 rotates relative to lead sweep plate 44 as pivot arm 74 is moved by a plurality of air cylinders through a comb massage cycle. Lead sweep cylinder 76 moves the pivot arm in one direction to first outer stop 78, and then in the opposite direction to second outer stop 80. The location of the first and second outer stops is determined by adjustable stops 82. The range of movement of pivot arm 74 can easily be increased or decreased by changing the setting of the adjustable stops. The degree of rotation by the pivot plate relative to the lead sweep plate may thereby be controlled by the operator.

As the lead sweep cylinder drives the pivot arm away from second outer stop 80, overbend cylinder 84 is activated moving overbend intermittent stop 86 into the path of pivot arm 74. Centering cylinder 88 is then activated, engaging centering overbend stop 90 to stop the pivot arm and center the pivot plate relative to the lead sweep plate. The timing of the operation of intermittent stops 86, 90 is controlled by the microprocessor.

Figure 3:
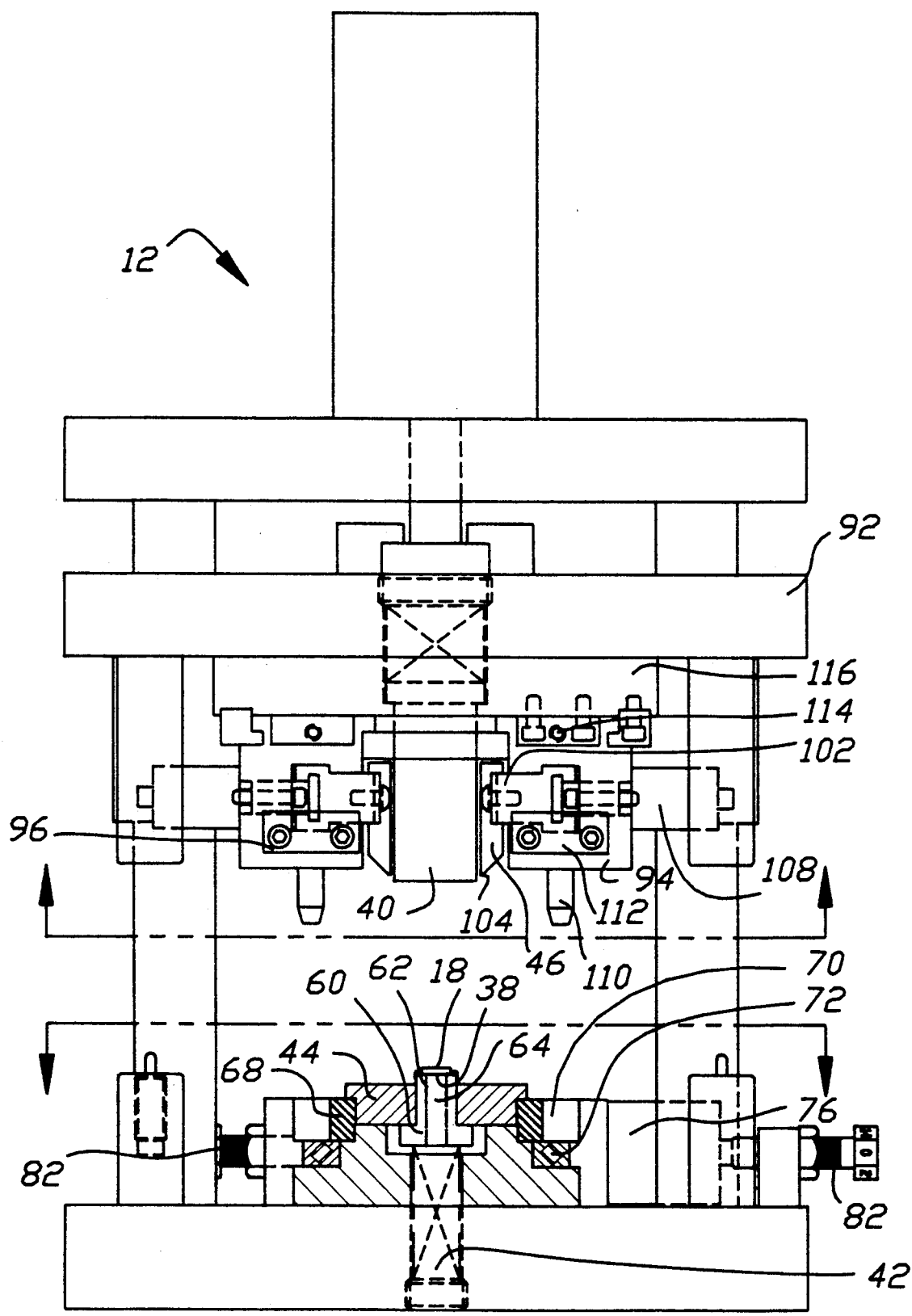
FIG. 3 shows a frontal view partially broken away of an engaging and massaging station in accordance with the present invention, shown in an open position.
Figure 4:
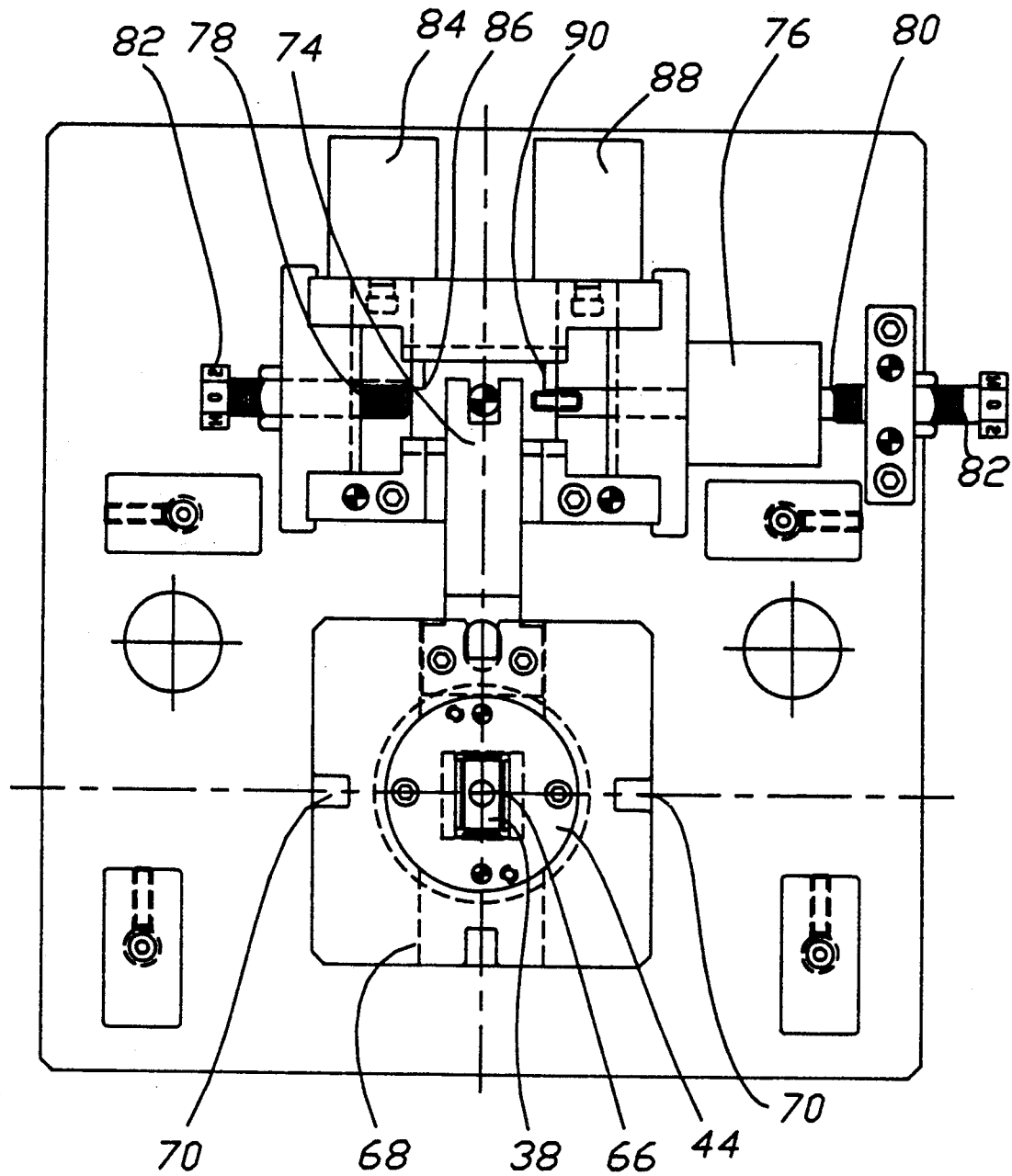
FIG. 4 shows a view of the engaging and massaging station taken substantially along line 4—4 in FIG. 3.
Figure 5:
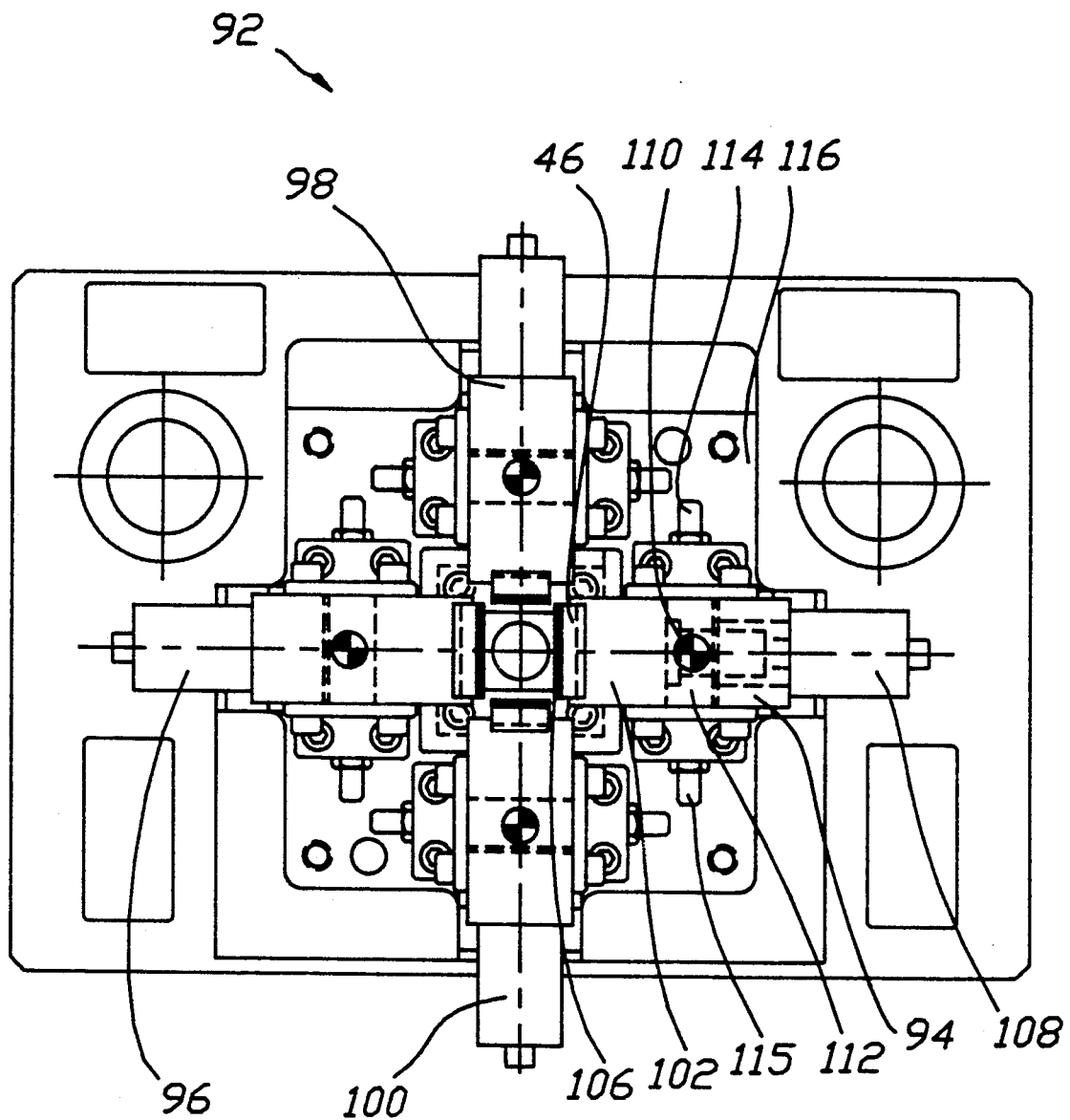
FIG. 5 shows a view of the engaging and massaging station taken substantially along line 5—5 in FIG. 3 showing the upper die.
Figure 6:
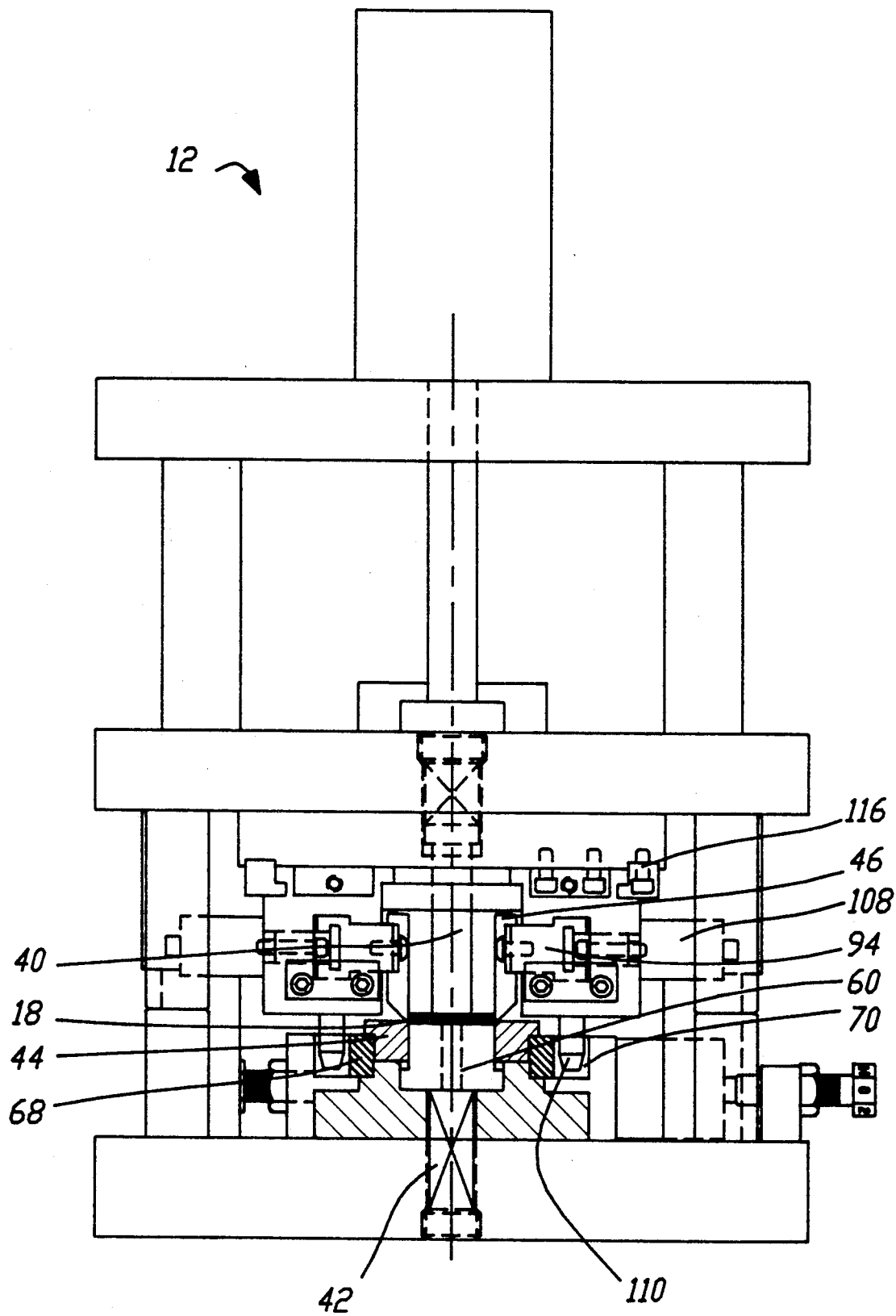
FIG. 6 shows a frontal view partially broken away of an engaging and massaging station in accordance with the present invention, pictured in a closed position.

Upper die 92 of the engaging and massaging station includes at least one comb assembly 94 generally opposing one side of package nest 38. In the preferred embodiment, engaging and massaging station 12 includes four comb assemblies 94, 96, 98, 100 as represented in FIG. 5. In FIGS. 3 and 6, for clarity, the front portion of the engaging and massaging station is broken away, showing only comb assemblies 94, 96. Including a different number of the comb assemblies in engaging and massaging station 12 is within the scope of the present invention. To simplify the discussion of the upper die, only the components of comb assembly 94 will be described. It is to be understood that the remaining comb assemblies are identical to comb assembly 94.

Comb assembly 94 includes comb 46, mounted to comb mounting block 102. To provide the strength and dimensions required for massaging the leads, the comb is beveled to tip 104 which is formed having a plurality of teeth 106. As shown in FIGS. 3 and 5, the teeth are formed only at the bottommost end of tip 104. The combination of a thick comb with a bevel to narrow teeth provides a great amount of strength in a relatively small cross sectional area. The teeth can thus engage and massage the leads without breaking.

The comb assembly includes means for moving the comb through the leads, such as slide cylinder 108. The comb mounting block is coupled to slide cylinder 108, which moves the comb from an engaging position, near the molded body of a semiconductor device positioned in the package nest, to a massaging position at the tips of leads 30 as indicated by the interrupted lines in FIG. 3. Alignment pin 110 is mounted to slide cap 112 of the upper die generally opposing alignment slot 70 of the pivot plate. Comb mounting block 102 slips along the slide cap, which holds the alignment pin stationary relative to the movement of the slide cylinder. Spring plungers 114, 115 connect comb mounting block 102 to top mounting plate 116 of the upper die, allowing for the oscillation of the comb in a direction perpendicular to the movement of the slide cylinder.

When the upper die is lowered to a closed position, shown in FIG. 6, pressure pin 40 pushes on the molded body, lowering elevator block 60. The lead sweep plate forces the leads upward relative to molded body 32. Alignment pin 110 is inserted into alignment slot 70, while comb 46 is inserted in between the leads and moved to a massaging position at the lead tips.

The alignment pin moves with the rotation of pivot plate 68, causing the comb mounting block to move between spring plungers 114, 115. Since alignment slot 70 is larger than alignment pin 110, the alignment pin travels slightly within the alignment slot, translating the rotation of the pivot plate into a linear movement of comb 46 in a direction substantially perpendicular to leads 30. As the pivot plate rotates, comb 46 massages the leads by bending them to either side of molded body 32. Thus, the pivot plate controls the oscillation of the comb.

In the preferred embodiment, the alignment pins of comb assemblies 94, 96, 98, 100 each are inserted into the corresponding alignment slot of the pivot plate. The rotation of the pivot plate moves the four combs perpendicular to the leads projecting from each side of semiconductor device 18, simultaneously reintroducing parallelism to all the leads. Thus, the engaging and massaging station of the present invention introduces a predetermined amount of spacing between the leads, bringing them into parallelism.

Figure 7:
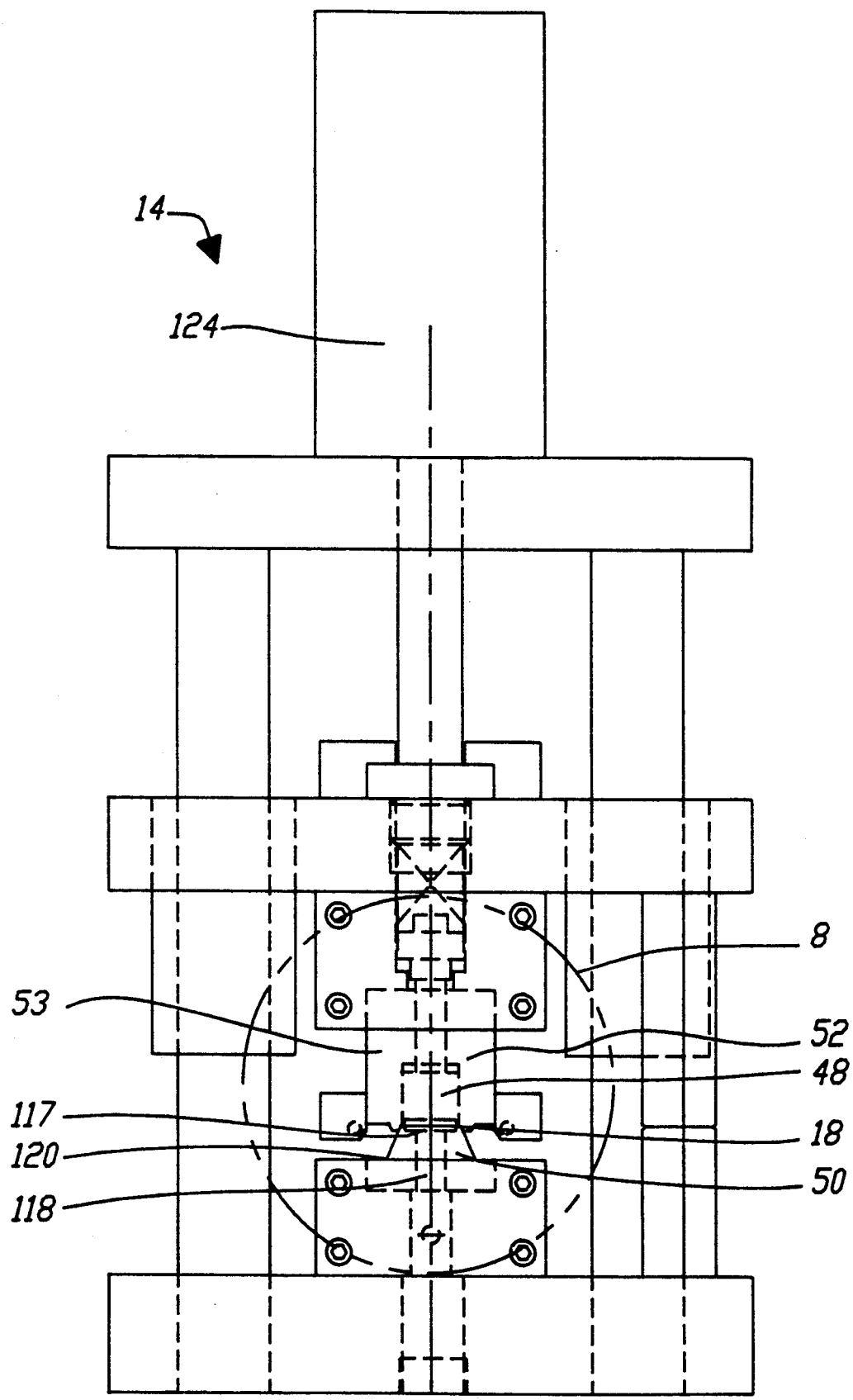
FIG. 7 shows a frontal view partially broken away of a forming station in accordance with the present invention.
Figure 8:
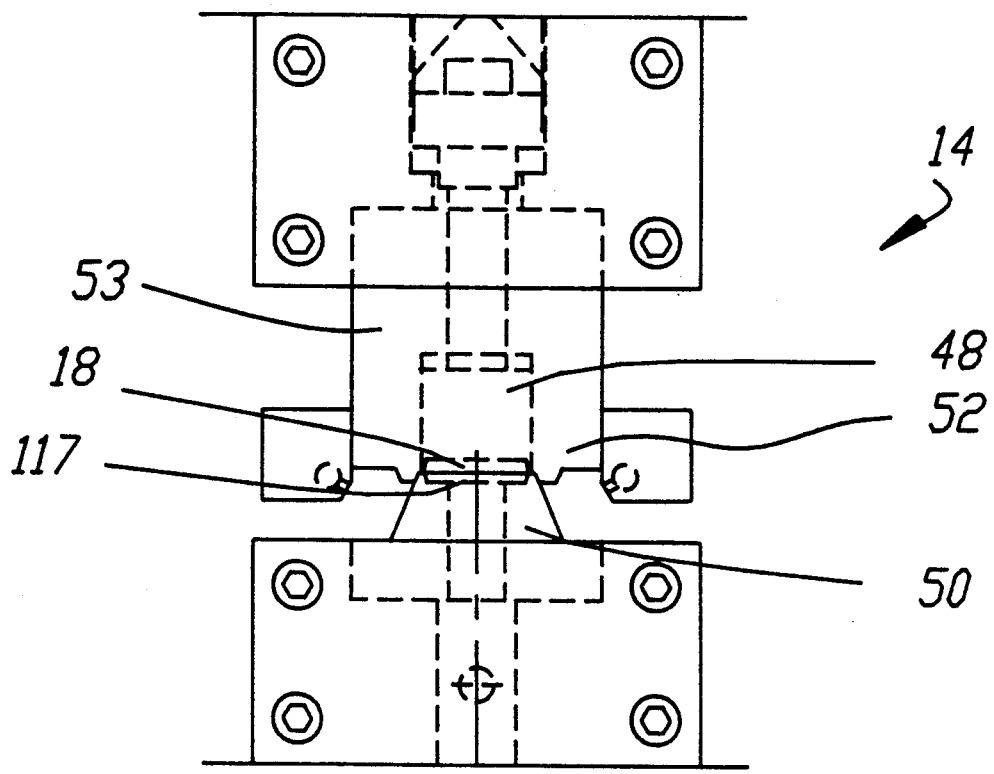
FIG. 8 shows an enlarged view of a portion of a forming station in accordance with the present invention.

After the parallelism has been reintroduced to the leads, semiconductor device 18 is transferred to forming station 14, shown in FIGS. 7 and 8. The forming station includes package nest 117 positioned within form anvil 50. The package nest includes means for sensing the proper placement of the semiconductor device, such as vacuum sensor 118. As discussed above in relation to engaging and massaging station 12, the vacuum sensor is placed within vacuum cup 120 connected to the environment by air access opening (not shown) in the package nest. The proper placement of the semiconductor device creates a vacuum, and the microprocessor activates air cylinder 124 initiating the operation of the forming station.

The forming station includes means for clamping the leads to the form anvil, such as spring loaded pressure pad 48. As is evident in FIG. 8, the pressure pad clamps the leads to the form anvil at a point near molded body 32, without exerting any pressure on the molded body. Since the semiconductor device is held in place by securing leads 30, the molded body will not be cracked or damaged as the leads are formed.

Also included in the forming device is at least one form punch 52 for partially opening any bends in the leads. In the preferred embodiment, four form punches are included each opposing one side of semiconductor device 18. For clarity, in FIGS. 7 and 8 the front portion of the forming station has been broken away, and only form punches 52, 53 are shown. Alternatively, a single form punch configured to surround molded body 32 may be used.

Form punch 52 and form anvil 50 are complimentarily configured to partially open any bends in leads 30, as is shown more clearly in FIG. 8. Opening the bends in the leads removes the elastic memory prior to reforming the leads in a desired configuration. Once the leads are reformed, they will not spring back to a bent position.

Figure 9:
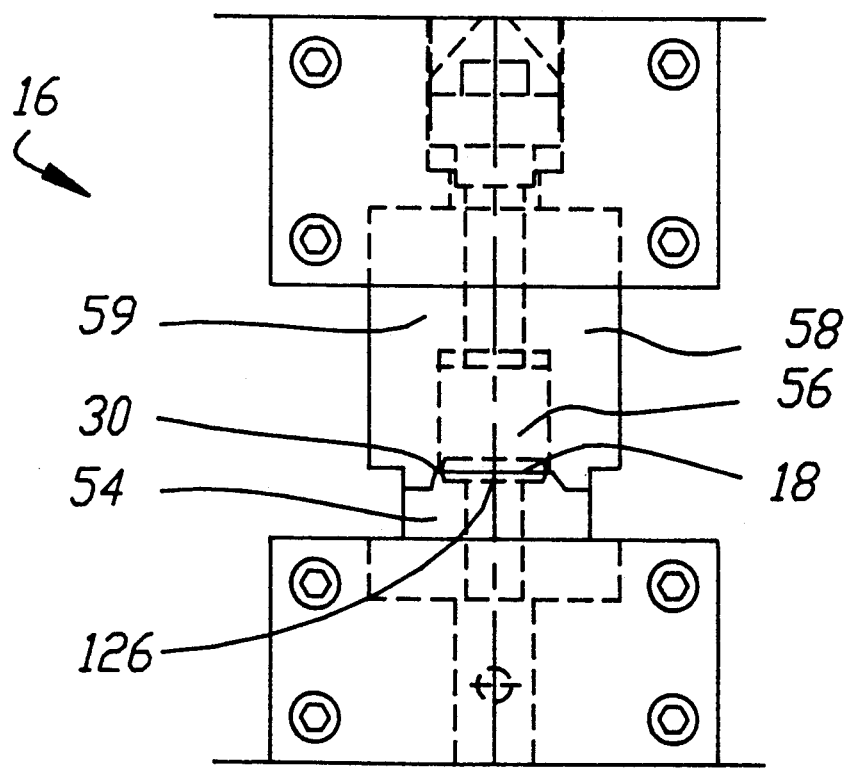
FIG. 9 shows an enlarged view of a portion of a reforming station in accordance with the present invention.

Reforming station 16 is similar in construction and operation to forming station 14, except that it includes reform anvil 54 and at least one opposing reform punch 58, as shown in FIG. 9. In the preferred embodiment, reforming station 14 includes four reform punches, each opposing one of the four sides of molded body 32. Reforming station 16 is shown in FIG. 9 partially broken away for clarity, only reform punches 58, 59 are shown. The semiconductor device is placed within package nest 126 and secured in place by lowering pressure pad 56 to clamp leads 30 to the reform anvil, as described in relation to forming station 14.

The reform anvil and reform punch are complementarily configured to reintroduce a predetermined configuration to leads 30 as the leads are compressed therebetween. By changing the shape of reform anvil 54 and reform punch 58, other configurations may be introduced to the leads. Thus, the reforming station of the present invention may be used for various types of semiconductor devices having parallel leads projecting from the molded body in a predetermined configuration.

In one embodiment of the present invention, semiconductor device 18 is manually transferred between the three stations. In an alternative embodiment, means for automatically transferring the semiconductor device, such as part handling shuttle 24, are included. The part handling shuttle of the preferred embodiment is equipped to simultaneously transfer a semiconductor device from each of the three stations to the next succeeding station. The three stations may each simultaneously condition a semiconductor device. Thus, lead conditioning apparatus 10 is capable of continuous operation.

Figure 10:
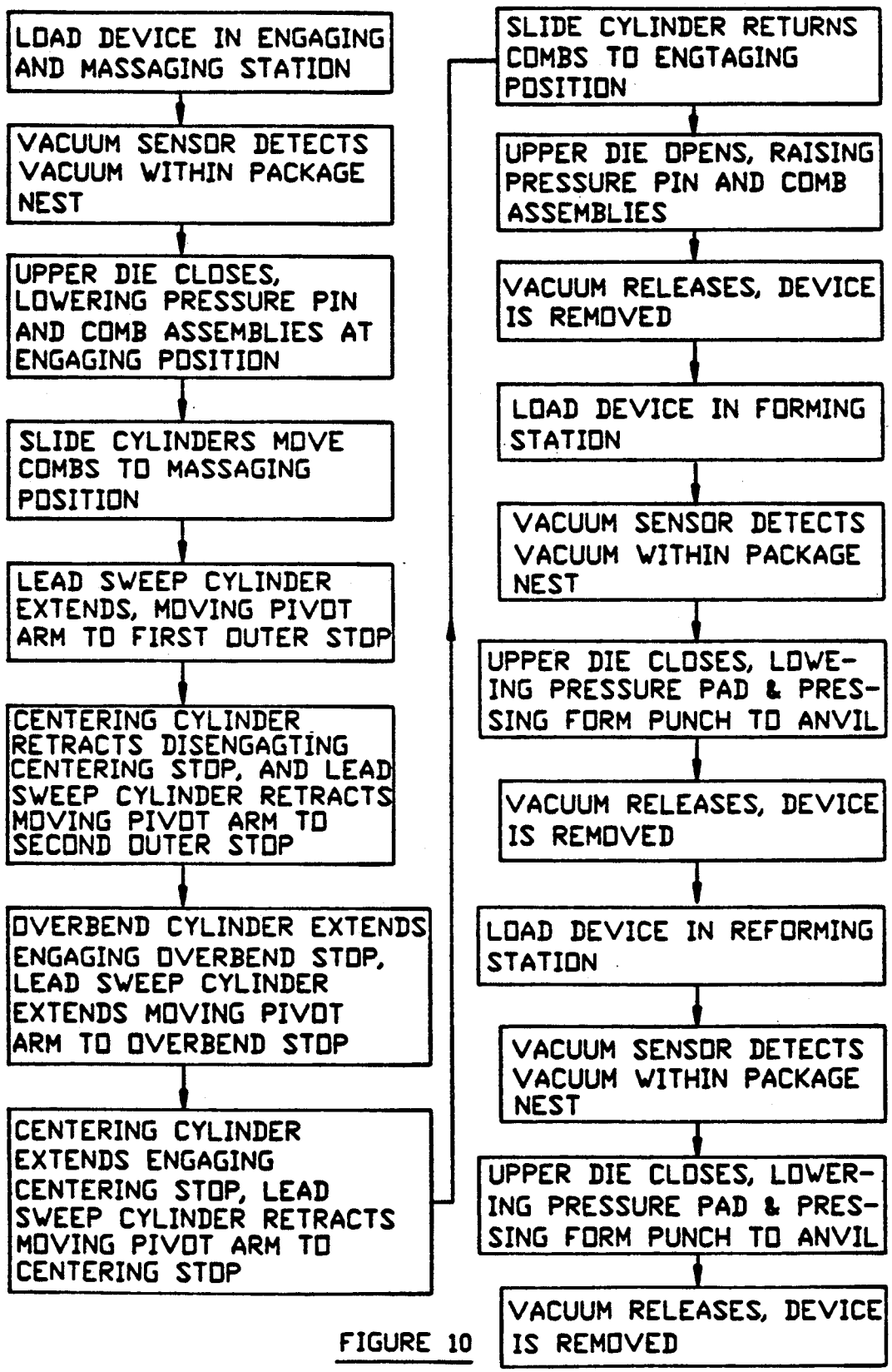
FIG. 10 is a flow chart showing the operational steps of a lead conditioning apparatus in accordance with the present invention.

A description of the method and sequence of operation of the lead conditioning apparatus of the present invention is represented in the flow chart of FIG. 10. To ensure proper alignment of pivot plate 68 of the engaging and massaging station, the air cylinders extend and retract, moving pivot arm 74 through a comb massage cycle while package nest 38 is empty. Semiconductor device 18 is then loaded into the engaging and massaging station to bring the bent leads into parallelism. Once the accurate placement of semiconductor device 18 has been sensed, the upper die closes lowering pressure pin 40 and comb assembly 94. The molded body is lowered relative to lead sweep plate 44, bending the leads upward. The combs are inserted in between the leads at an engaging position near molded body 32.

Slide cylinder 108 extends, moving comb 46 from the engaging position to a massaging position at the tips of leads 30. The comb is oscillated at least once by the extension and retraction of the air cylinders, bending the leads alternatively toward either end of molded body 32 to remove the elastic memory of the pressed together position. The upper die is opened, raising the comb and leaving the leads projecting perpendicularly from the molded body.

The semiconductor device is transferred from the engaging and massaging station to the forming station, where the leads are formed into an at least partially unbent condition. The accurate placement of the device on the form anvil is sensed, and the upper die closes lowering pressure pad 48 to clamp the leads on form anvil 50. Form punch 52 is pressed against the form anvil, compressing the leads and partially opening any bends. The upper die opens, raising the form punch and pressure pad.

After the bends have been partially opened in the forming station, the semiconductor device is loaded in the reforming station for shaping the leads into a desired configuration. The accurate placement of the semiconductor device on reform anvil 54 is sensed, and the upper die closes lowering pressure pad 56 and reform punch 58 to the reform anvil. Reform punch 58 is pressed against the reform anvil, compressing the leads into a predetermined configuration. After the leads have been compressed, the upper die opens, raising the pressure pad and reform punch. The conditioned semiconductor device has parallel leads projecting from the molded body in a predetermined configuration, and is ready for mounting on a circuit board.

I claim:

1. An apparatus for conditioning the bent leads of a semiconductor device of the type normally having parallel leads projecting from a body in a predetermined configuration comprising:
    means for engaging said leads, said engaging means being configured for insertion in between and complete engagement of said leads;
    means for massaging said leads to reintroduce a predetermined spacing between each of said leads projecting from said body to bring said leads into parallelism, said massaging means including means for moving said engaging means along said leads away from said body towards the ends of said leads in a first direction substantially parallel to said leads with said engaging means inserted between and in complete engagement with said leads;
    means for forming said leads to remove memory from said leads of said predetermined configuration and any bends distorting said predetermined configuration; and
    means for reforming said leads to said predetermined lead configuration.

2. The apparatus of claim 1 wherein said engaging means includes at least one comb having a plurality of teeth having a width corresponding to said predetermined spacing for engaging said leads, each of said teeth being configured for insertion in between and complete engagement of said leads.

3. The apparatus of claim 2 wherein said massaging means includes means for moving said comb back and forth at least once in a second direction substantially perpendicular to said first direction.

4. The apparatus of claim 1 wherein said semiconductor device has four sides and wherein said engaging means includes at least one comb for each of said four sides of said semiconductor device, said combs having a plurality of teeth having a width corresponding to said predetermined spacing, said teeth configured for entering in between and completely engaging said leads projecting from said four sides of said semiconductor device, said massaging means moving said four combs simultaneously along said leads away from said body towards said ends of said leads in a direction substantially parallel to the engaged leads to reintroduce a predetermined amount of spacing between said leads.

5. The apparatus of claim 1 including means for sensing the proper positioning of said semiconductor device for the conditioning of said leads.

6. The apparatus of claim 5 wherein said sensing means includes a package nest conforming to the shape of said body and a vacuum cup positioned within said package nest, said package nest having an opening providing for air access to said vacuum cup, said vacuum cup having a vacuum sensor whereby when said semiconductor device is accurately placed in said package nest with said body completely covering said opening, a vacuum is created signaling the proper positioning of said semiconductor device.

7. The apparatus of claim 1 including means for moving said semiconductor device into position for the conditioning of said leads.

8. An apparatus for conditioning the bent leads of a semiconductor device of the type normally having parallel leads projecting from a body in a predetermined configuration comprising:
    means for engaging and massaging said leads to reintroduce a predetermined spacing between each of said leads projecting from said body to bring said leads into parallelism;
    means for forming said leads to remove memory from said leads of said predetermined configuration and any bends distorting said predetermined configuration, said forming means including a form anvil having a package nest for supporting said body, means for clamping said leads to said form anvil and at least one form punch, said form anvil and said form punch having complementary configurations for at least partially opening said bends and said predetermined configuration when said form punch and said form anvil are pressed together; and
    means for reforming said leads to said predetermined lead configuration.

9. The apparatus of claim 1 wherein said reforming means includes a reform anvil having a package nest for supporting said body, means for clamping said leads to said reform anvil and at least one reform punch, said reform anvil and said reform punch having complementary configurations for introducing said predetermined configuration to said leads when said reform punch and said reform anvil are pressed together.

10. An apparatus for conditioning the bent leads of a semiconductor device normally having parallel leads projecting from a body in a predetermined configuration comprising:

means for engaging said leads at a point near said body;

means for moving said engaging means from said point near said body toward the tips of said leads in a first direction parallel to said leads with said engaging means inserted in between and completely engaging said leads;

means for massaging said leads to reintroduce said parallelism to said leads projecting from said semiconductor device, said massaging means being configured for moving said engaging means in a second direction substantially perpendicular to said first direction with said engaging means positioned near said tips of said leads;

means for forming said leads to at least partially remove said predetermined configuration and any bends distorting said predetermined configuration; and means for reforming said leads to said predetermined configuration.

11. The apparatus of claim 10 wherein said moving means includes at least one slide cylinder for moving said engaging means to said tips and temporarily holding said engaging means at said tips while reintroducing said parallelism.

12. The apparatus of claim 10 wherein said massaging means includes a rotatable pivot plate for moving said engaging means in said second direction having a pivot arm extending therefrom and a plurality of air cylinders for driving said pivot arm in at least one comb massage cycle which includes moving said arm in one direction to a first outer stop and then in an opposite direction to a second outer stop, reversing direction and moving said arm towards said first outer stop to an intermittent overbend position, and reversing direction again and moving said arm to an intermittent centering position.

13. The apparatus of claim 12 wherein said massaging means further includes first and second adjustable stops for fixing the location of said first and said second outer stops.

14. The apparatus of claim 12 wherein said massaging means further includes a microprocessor for controlling the timing of said cylinders to stop said pivot arm at said overbend and said centering positions.

15. The apparatus of claim 10 including means for bending said leads partially towards said body for facilitating massaging of said leads.

16. The apparatus of claim 15 wherein said bending means includes a package nest for supporting said body with said leads projecting from said package nest and a lead sweep plate surrounding said package nest, at least one of said package nest and said lead sweep plate being movable relative to the other such that, after movement, said leads are bent towards said body by said lead sweep plate.

17. A method for conditioning bent leads of a semiconductor device which normally has a plurality of parallel uniformly configured leads projecting from a body which comprises the steps of:

inserting at least one comb having a plurality of teeth in between said leads near said body with said teeth completely engaging said leads;

bringing said leads into parallelism by moving said comb along said leads away from said body toward the ends of said leads in a first direction substantially parallel to said leads, said teeth completely engaging said leads as said comb is moved from said body to said ends;

forming said leads to a partially unbent condition; and shaping said leads in a desired lead configuration.

18. The method of claim 17 wherein said step of bringing said leads into parallelism includes the step of moving said comb back and forth in a second direction substantially perpendicular to said first direction.

19. The method of claim 18 wherein said moving step includes rotating a pivot plate by driving a pivot arm projecting from said pivot plate through a comb massage cycle which includes moving said pivot arm in one direction to a first outer stop, moving said pivot arm in an opposite direction to a second outer stop, reversing direction and moving said pivot arm towards said first outer stop to an intermittent overbend position, and moving said pivot arm in said opposite direction towards said second outer stop to an intermittent centering position.

20. The method of claim 17 wherein said step of bringing said leads into parallelism includes bending said leads towards said body.

21. The method of claim 17 wherein said step of bringing said leads into parallelism includes inserting a comb having a plurality of teeth in between said leads along each side of said semiconductor device having said leads projecting therefrom with said teeth completely engaging said comb and simultaneously moving said combs back and forth at least once in a direction substantially perpendicular to said leads engaged by each of said combs.

22. The method of claim 17 including the step of sensing the proper positioning of said semiconductor device for the conditioning of said leads.

23. The method of claim 17 wherein said shaping step includes compressing said leads between a reform anvil and at least one reform punch to introduce said desired configuration to said leads.

24. A method for conditioning bent leads of a semiconductor device which normally has a plurality of parallel uniformly configured leads projecting from a body which comprises the steps of:

bring said leads into parallelism;

forming said leads to a partially unbent condition, said forming step including compressing said leads between a form anvil and at least one form punch to at least partially remove any bends from said leads; and shaping said leads in a desired lead configuration.

25. An apparatus for conditioning the bent leads of a semiconductor device having a plurality of parallel leads projecting from a body in a predetermined configuration comprising:

at least one comb having a plurality of teeth configured for insertion in between and complete engagement of said leads projecting from said semiconductor device;

means for moving said comb along said leads from an engaging position near the body of said semiconductor device to a massaging position near the tips of said leads in a first direction substantially parallel to said leads with said teeth inserted in between and in complete engagement with said leads; and means for massaging said leads by moving said comb back and forth at said massaging position at least once in a second direction substantially perpendicular to said first direction.

26. The apparatus of claim 25 wherein said teeth have beveled tips for insertion in between said leads.

27. The apparatus of claim 25 including means for bending said leads towards said body for facilitating the massaging of said leads.

28. The apparatus of claim 25 including one of said combs for each side of said semiconductor device which has leads projecting from said body, and including means for simultaneously moving each of said combs back and forth in a direction substantially perpendicular to said leads engaged by each of said combs.

29. The apparatus of claim 25 including means for forming said leads to at least partially remove any bends and said predetermined configuration from said leads.

30. The apparatus of claim 25 including means for reforming said leads to said predetermined configuration.

* * * * *